(12) United States Patent
Zhang et al.

(10) Patent No.: US 6,679,717 B2
(45) Date of Patent: Jan. 20, 2004

(54) ELECTRICAL CONNECTOR WITH ANTI-MISMATCHING MECHANISM

(75) Inventors: Jian Zhang, Kunsan (CN); Jie Jun Luo, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 5 days.

(21) Appl. No.: 10/315,625

(22) Filed: Dec. 9, 2002

(65) Prior Publication Data

US 2003/0228786 A1 Dec. 11, 2003

(30) Foreign Application Priority Data

Jun. 8, 2002 (TW) ........................... 91209769 U

(51) Int. Cl.$^7$ ............................................. H01R 13/625
(52) U.S. Cl. ..................... 439/342; 439/680; 439/677
(58) Field of Search ............................. 439/342, 677, 439/674, 680, 378, 259–270

(56) References Cited

U.S. PATENT DOCUMENTS 4,764,129 A * 8/1988 Jones et al. ................. 439/677
5,569,045 A * 10/1996 Hsu ............................. 439/342

* cited by examiner

Primary Examiner—Tho D. Ta
(74) Attorney, Agent, or Firm—Wei Te Chung

(57) ABSTRACT

An electrical connector (1) includes a base (2) electrically connectable to a printed circuit board, a cover (3) slidably mounted on the base, and an actuation device (4) for actuating the cover to slide along the base. The base forms a projection (221) thereon, and the cover defines a corresponding sliding slot (321). The sliding slot slidably receives the projection when the base and the cover are attached together. The base having the projection is configured to match only the cover having the sliding slot. Thus when assembling a base and a cover during manufacturing of multiple types of electrical connectors having similar structures, an operator can avoid mismatching of a base with the wrong cover, or vice versa. In an alternative embodiment, a projection (322') is formed on a cover (3'), and a corresponding sliding slot (221') is defined in a base (2').

13 Claims, 3 Drawing Sheets

ELECTRICAL CONNECTOR WITH ANTI-MISMATCHING MECHANISM

BACKGROUND OF THE INVENTION

1. Field of the Invention

The present invention relates to an electrical connector with an anti-mismatching mechanism, the electrical connector being adapted to electrically connect an integrated circuit (IC) package to a printed circuit board (PCB).

2. Description of the Related Art

A conventional zero insertion force (ZIF) electrical connector is used to electrically connect an IC package to a PCB. The connector comprises a base associated with the PCB, and a cover slidably mounted on the base. IC package designs are continually evolving from generation to generation. A new generation of an IC package may either closely follow the original design of the former generation, or have a substantially new structure compared with the original design of the former generation. When only a single type of an connector is made, it is simple to make only one kind of base and one kind of cover thereof. However, in many instances, multiple types of connectors having some commonality are manufactured. These connectors share common parts, and can satisfy the different needs of different generations of IC packages. However, mistaken installation of the common parts can occur. For example, a commonly used cover of one type of connector may be mounted on the base of another type of connector in error. As a result, the assembled connector will not function normally. Conventional connectors liable to this problem are disclosed in U.S. Pat. Nos. 5,722,848, 5,833,483, 5,947,778 and 6,231,367, and in a related scientific article entitled Development of ZIF BGA Socket (Connector Specifier, May 2000).

Hence, a new connector having a structure for preventing mismatching is desired to overcome the above-described disadvantages.

SUMMARY OF THE INVENTION

An object of the present invention is to provide an electrical connector having an effective anti-matching mechanism to avoid mismatching of a base and a cover of two different types of connector.

In order to achieve the aforementioned object, an electrical connector with an anti-matching mechanism in accordance with a preferred embodiment of the present invention comprises a base electrically connectable to a PCB, a cover slidably mounted on the base, and an actuation device for actuating the cover to slide along the base. The base forms a projection thereon, and the cover defines a corresponding sliding slot. The sliding slot slidably receives the projection when the base and the cover are attached together. The base having the projection is configured to match only the cover having the sliding slot. Thus when assembling a base and a cover during manufacturing of multiple types of electrical connectors having similar structures, an operator can avoid mismatching of a base with the wrong cover, or vice versa. In an alternative embodiment, a projection is formed on a cover, and a corresponding sliding slot is defined in a base.

Other objects, advantages and novel features of the present invention will become more apparent from the following detailed description when taken in conjunction with the accompanying drawings.

DESCRIPTION OF THE PREFERRED EMBODIMENT

Figure 1:
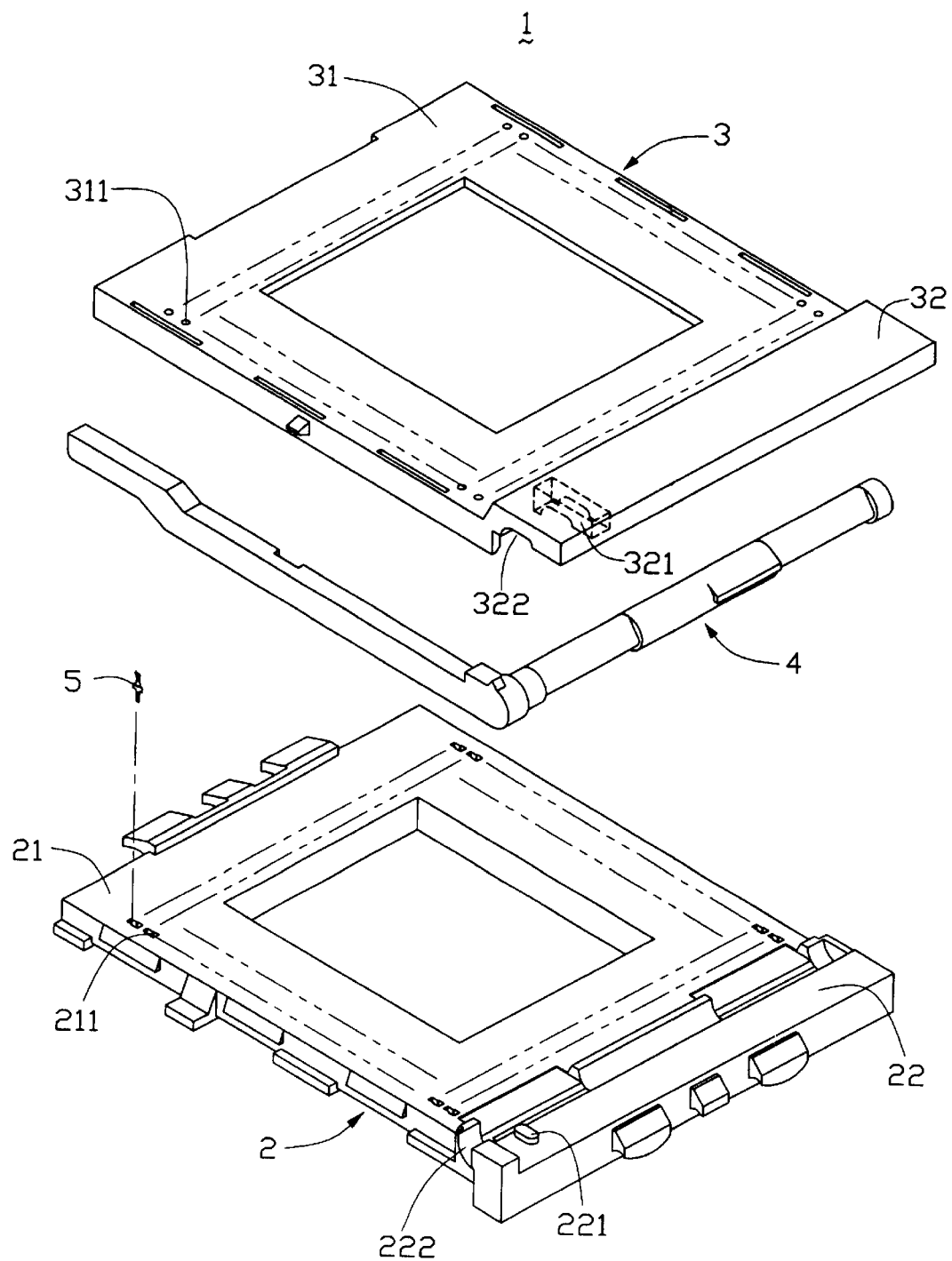
FIG. 1 is a simplified, exploded isometric view of an electrical connector in accordance with a preferred embodiment of the present invention.

Reference will now be made to the drawing figures to describe the present invention in detail.

Referring to FIG. 1, an electrical connector 1 of the present invention is adapted to electrically connect an integrated circuit (IC) package (not shown) to a printed circuit board (not shown). The electrical connector 1 comprises an insulative base 2, a cover 3 slidably mounted on the base 2, and an actuation device 4 for actuating the cover 3 to slide along the base 2.

The base 2 comprises a top surface 21 adapted to slidably support the cover 3, and a first end 22 defining a first receiving slot 222 for holding the actuation device 4. The base 2 defines a plurality of receiving holes 211 therethrough. A plurality of conductive contacts 5 is installed in the receiving holes 211, for electrically mating with pins of the IC package. A projection 221 is formed on a top of the first end 22 of the base 2, near a corner of the base 2.

The cover 3 is used for carrying the IC package thereon. The cover 3 comprises a top mating face 31, and defines a plurality of through holes 311 therethrough corresponding to the receiving holes 211 of the base 2. The cover 3 further comprises a second end 32, corresponding to the first end 22 of the base 2. A second receiving slot 322 is defined in the second end 32, for cooperating with the first receiving slot 222 of the base 2 to hold the actuation device 4 therein. A sliding slot 321 is defined in an underside of the second end 32, for slidably receiving the projection 211 of the base 2.

Figure 2:
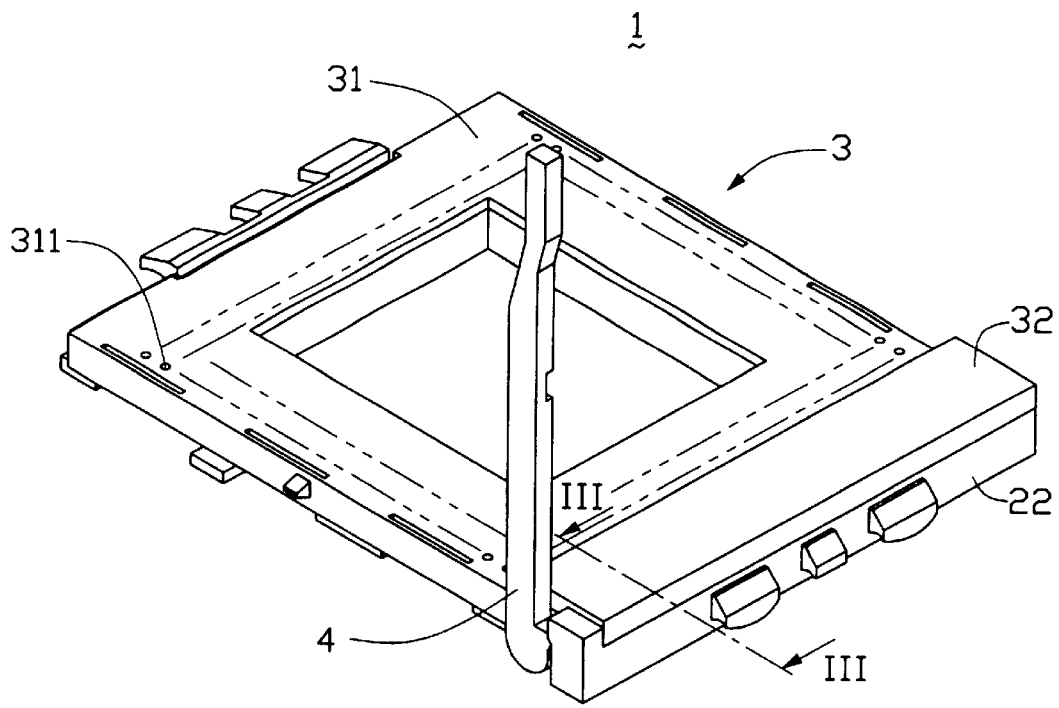
FIG. 2 is an assembled view of FIG. 1.
Figure 3:
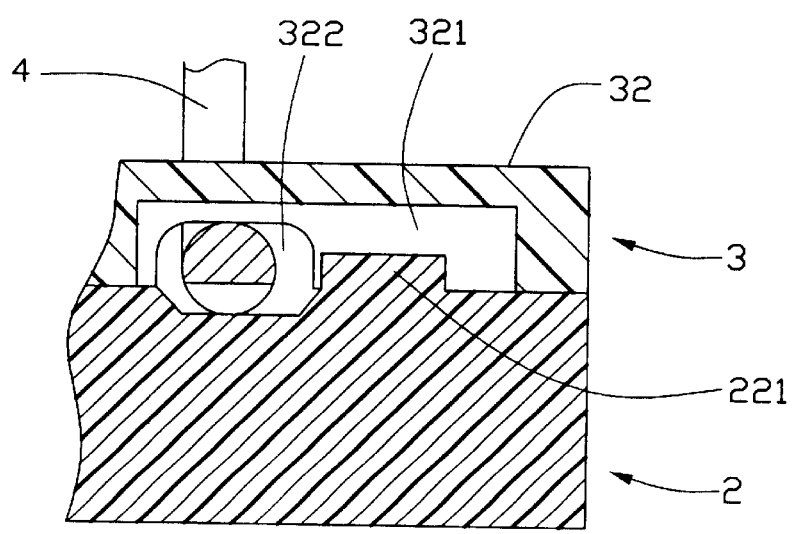
FIG. 3 is a cross-sectional view taken along line III—III of FIG. 2.

Referring to FIGS. 2 and 3, when the cover 3 is attached to the base 2, the projection 221 is slidably received in the sliding slot 321. When the cover 3 is actuated to slide along the base 2, the projection 211 slides in the sliding slot 321 synchronously. Additionally, the base 2 having the projection 221 is configured to match only the cover 3 having the sliding slot 321. Other electrical connectors each comprise a base having a projection with a configuration different from that of the projection 221. Each of such other connectors cannot be mated with the cover 3 of the electrical connector 1. Similarly, other electrical connectors each comprise a cover having a sliding slot with a configuration different from that of the sliding slot 321. Each of such other connectors cannot be mated with the base 2 of the electrical connector 1. Thus the projection 211 of the base 2 and the sliding slot 321 of the cover 3 effectively prevent mismatching of the base 2 and the cover 3. In particular, when assembling a base and a cover during manufacturing of multiple types of electrical connectors having similar structures, an operator can avoid mismatching of a base with the wrong cover, or vice versa.

Figure 4:
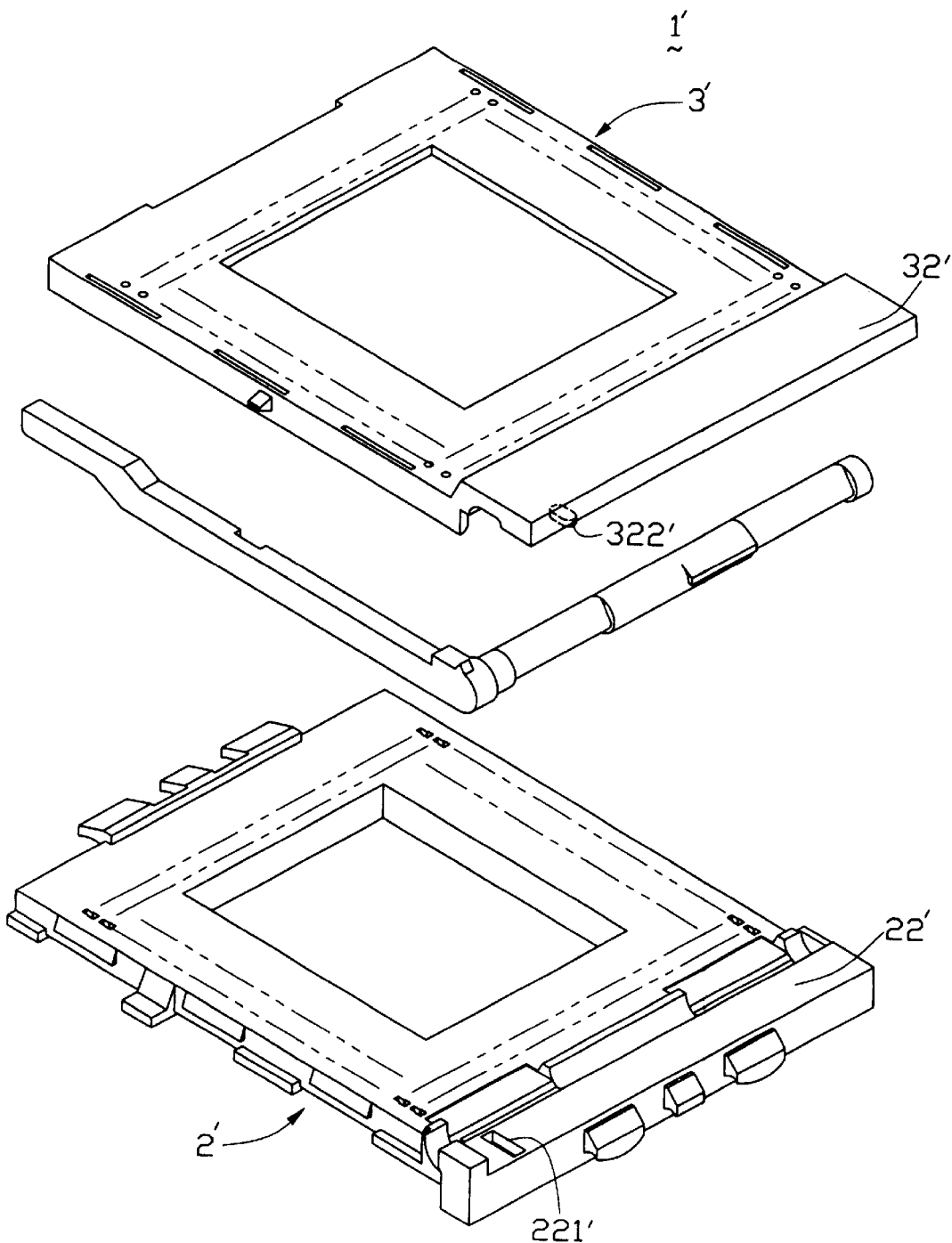
FIG. 4 is a simplified, exploded isometric view of an electrical connector in accordance with an alternative embodiment of the present invention.

Referring to FIG. 4, an electrical connector 1' in accordance with an alternative embodiment of the present invention has a structure similar to that of the electrical connector 1 of the preferred embodiment. The electrical connector 1' comprises a base 2' and a cover 3'. The base 2' comprises a first end 22' defining a sliding slot 221', and the cover 3' comprises a second end 32' forming a projection 322'. When the cover 3' is actuated to slide along the base 2', the projection 322' slides in the sliding slot 221' synchronously.

The electrical connector 1' can perform substantially the same functions as described above in relation to the electrical connector 1 of the preferred embodiment.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. An electrical connector for electrically connecting an integrated circuit package to a circuit board, the electrical connector comprising:

a base defining a plurality of receiving holes receiving a plurality of contacts therein, and forming a first receiving slot thereon;

a cover slidably mounted on the base and defining a plurality of through holes corresponding to the receiving holes of the base, and forming a second receiving slot corresponding to the first receiving slot; and an actuation device sandwiched between the base and the cover by means of cooperation of the first and second receiving slots; wherein projection is provided on one of the base and the cover, and a sliding slot matching with the projection is defined in the other of the base and the cover, and the projection is slidable in the sliding slot when the base and the cover are attached together.

2. The electrical connector as described in claim 1, wherein the projection is provided on the base, and the sliding slot is defined in the cover.

3. The electrical connector as described in claim 2, wherein the base comprises a first end, the cover comprises a second end, the projection is defined in the first end, and the sliding slot is defined in the second end.

4. The electrical connector as described in claim 1, wherein the projection is provided on the cover, and the sliding slot is defined in the base.

5. The electrical connector as described in claim 4, wherein the base comprises a first end, the cover comprises a second end, the projection is provided on the second end, and the sliding slot is defined in the first end.

6. An electrical connector comprising:

a base defining a plurality of receiving boles receiving a plurality of contacts therein, and forming a first receiving slot thereon;

a cover slidably mounted on the base and defining a plurality of through holes corresponding to the receiving holes of the base, and forming a second receiving slot corresponding to the first receiving slot; and an actuation device sandwiched between the base and the cover by means of cooperation of the first and second receiving slots; wherein the base and the cover comprise complementary interengaging anti-mismatching means adapted to avoid mismatching of the base and the cover.

7. The electrical connector as described in claim 6, wherein the anti-mismatching means comprises a projection and a corresponding sliding slot.

8. The electrical connector as described in claim 7, wherein the projection is formed on the base, and the sliding slot is defined in tie cover.

9. The electrical connector as described in claim 8, wherein the base and the cover comprise a first end and a second end respectively, the projection is arranged on the first end, and the sliding slot is defined in the second end.

10. The electrical connector as described in claim 7, wherein the projection is formed on the cover, and the sliding slot is defined in the base.

11. The electrical connector as described in claim 10, wherein the base and the cover comprise a first end and a second end respectively, the projection is arranged on the second end, and the sliding slot is defined in the first end.

12. A method of assembling a plurality of different models electrical sockets without risks of mis-assembling, comprising steps of:

providing a plurality of different models electrical socket with different covers attached to the different bases in a vertical direction, respectively;

providing anti-misassembling means on both the cover and the base for each socket, either positions or configurations of said anti-misassembling means of said different sockets being different from one another; wherein the different anti-misassembling means on different covers and bases are offset from each other during assembling while those of the same socket being compliantly aligned with each other, thus preventing mis-assembling between the cover and the base belonging to different models; wherein each of said anti-misassembling means includes a projection formed on one of the cover and the base of the corresponding socket, and a sliding slot formed in the other of the cover and the base of the corresponding socket, said projection being moveable in the sliding slot along a front-to-back direction perpendicular to said vertical direction, both of said projection and said sliding slot being protectively fully hidden from an exterior in both vertical and front-to-back directions during operation.

13. The method as described in claim 12, wherein said anti-misassembling means is formed on a bottom face of the cover and a top face of the base, respectively.

* * * * *